US012712553B2

(12) United States Patent
J et al.

(10) Patent No.: US 12,712,553 B2
(45) Date of Patent: Aug. 18, 2026

(54) GAIN CALIBRATION OF DIGITAL-TO-TIME CONVERTER (DTC) USED IN FRACTIONAL FREQUENCY DIVIDERS

(71) Applicant: Shaoxing Yuanfang Semiconductor Co., Ltd., Shaoxing (CN)

(72) Inventors: Raja Prabhu J, Bangalore (IN); Rakesh Kumar Gupta, Bangalore (IN); Debasish Behera, Bangalore (IN); Augusto Manuel Marques, Norwich (GB); Ankit Seedher, Bangalore (IN)

(73) Assignee: Ningbo Aura Semiconductor Co., Ltd, Ningbo (CN)

( * ) Notice: Subject to any disclaimer, the term of this patent is extended or adjusted under 35 U.S.C. 154(b) by 15 days.

(21) Appl. No.: 19/023,493

(22) Filed: Jan. 16, 2025

(65) Prior Publication Data

US 2025/0323648 A1 Oct. 16, 2025

(30) Foreign Application Priority Data

Apr. 10, 2024 (IN) ............................ 202441029280

(51) Int. Cl.
*H03L 7/085* (2006.01)
*H03L 7/197* (2006.01)
*H04L 7/033* (2006.01)

(52) U.S. Cl.
CPC ............ *H03L 7/085* (2013.01); *H03L 7/1976* (2013.01); *H04L 7/0331* (2013.01)

(58) Field of Classification Search
CPC ...... H03L 7/085; H03L 7/1976; H04L 7/0331
See application file for complete search history.

(56) References Cited

U.S. PATENT DOCUMENTS

| | | | | |
|---|---|---|---|---|
| 9,531,394 | B1 | 12/2016 | Caffee et al. | |
| 9,608,641 | B2 | 3/2017 | Van Den Heuvel et al. | |
| 10,917,078 | B2 | 2/2021 | Wu et al. | |
| 11,175,633 | B2 | 11/2021 | Yao et al. | |
| 11,632,116 | B2 | 4/2023 | Perrott | |
| 2019/0310587 | A1* | 10/2019 | Kim | H04B 17/14 |
| 2022/0014208 | A1* | 1/2022 | Choi | H03M 3/322 |
| 2023/0179215 | A1* | 6/2023 | Janardhanan | H03M 1/1014 341/120 |

(Continued)

OTHER PUBLICATIONS

Wanghua Wu, A 28-nm 75-fsrms Analog Fractional-N Sampling PLL With a Highly Linear DTC Incorporating Background DTC Gain Calibration and Reference Clock Duty Cycle Correctio, 2019, 12 pages, IEEE Journal of Solid-State Circuits.

(Continued)

*Primary Examiner* — Sibin Chen

(74) *Attorney, Agent, or Firm* — IPHORIZONS PLLC; Narendra Reddy Thappeta

(57) ABSTRACT

An open-loop modulator (OLM) in a fractional frequency divider. A high-pass filter is applied to residual error output of a delta-sigma modulator of the OLM. The filtering is obtained as a part of matching the signal transfer function of the combination of a portion of the DSM generating the residual error and a matching block with that of the combination of a calibration PLL and a phase detector of a gain calibration circuit contained in the OLM. The gain calibration circuit cancels a gain error of digital-to-time converter (DTC) contained in the OLM.

20 Claims, 8 Drawing Sheets

(56) References Cited

U.S. PATENT DOCUMENTS

2024/0072821 A1 * 2/2024 Perrott ........... H03K 19/018564

OTHER PUBLICATIONS

Bindi Wang, A Digital to Time Converter with Fully Digital Calibration Scheme for Ultra-Low Power ADPLL in 40 nm CMOS, 2015, 04 pages, IEEE.

N. Markulic, A Fractional-N Subsampling PLL based on a Digital-to-Time Converter, May 30-Jun. 3, 2016, 06 pages, IEEE.

Bangan Liu, A Fully Synthesizable Fractional-N MDLL With Zero-Order Interpolation-Based DTC Nonlinearity Calibration and Two-Step Hybrid Phase Offset Calibration, Nov. 1, 20202,14 pages, IEEE Transactions on Circuits and Systems.

Gang Zhang, Digital-to-Time Converter Gain Calibration with a Muxed Delay Locked Loop, 2019, 02 pages, IEEE International Conference on Integrated Circuits, Technologies and Applications.

Ahmed Elkholy, Low-Jitter Multi-Output All-Digital Clock Generator Using DTC-Based Open Loop Fractional Dividers, 2018, 12 pages, IEEE Journal of Solid-State Circuits.

* cited by examiner fref (125)
265
Ndiv1 (132)
f-div (145)
Ndtc (135)
f-frac (155)
fout (165)
1
2
3
4
5
6
7
8
9
10
11
12
13
14
15
16
17
4
4
4
5
1/4
2/4
3/4
0
t251
t254
t257
t259
Time cal-PLL-PD-output (360-s)
0
Ndtc (335)
0
phase-error (377)
t491
t492
t493
t494
t495
t496
t497
Time

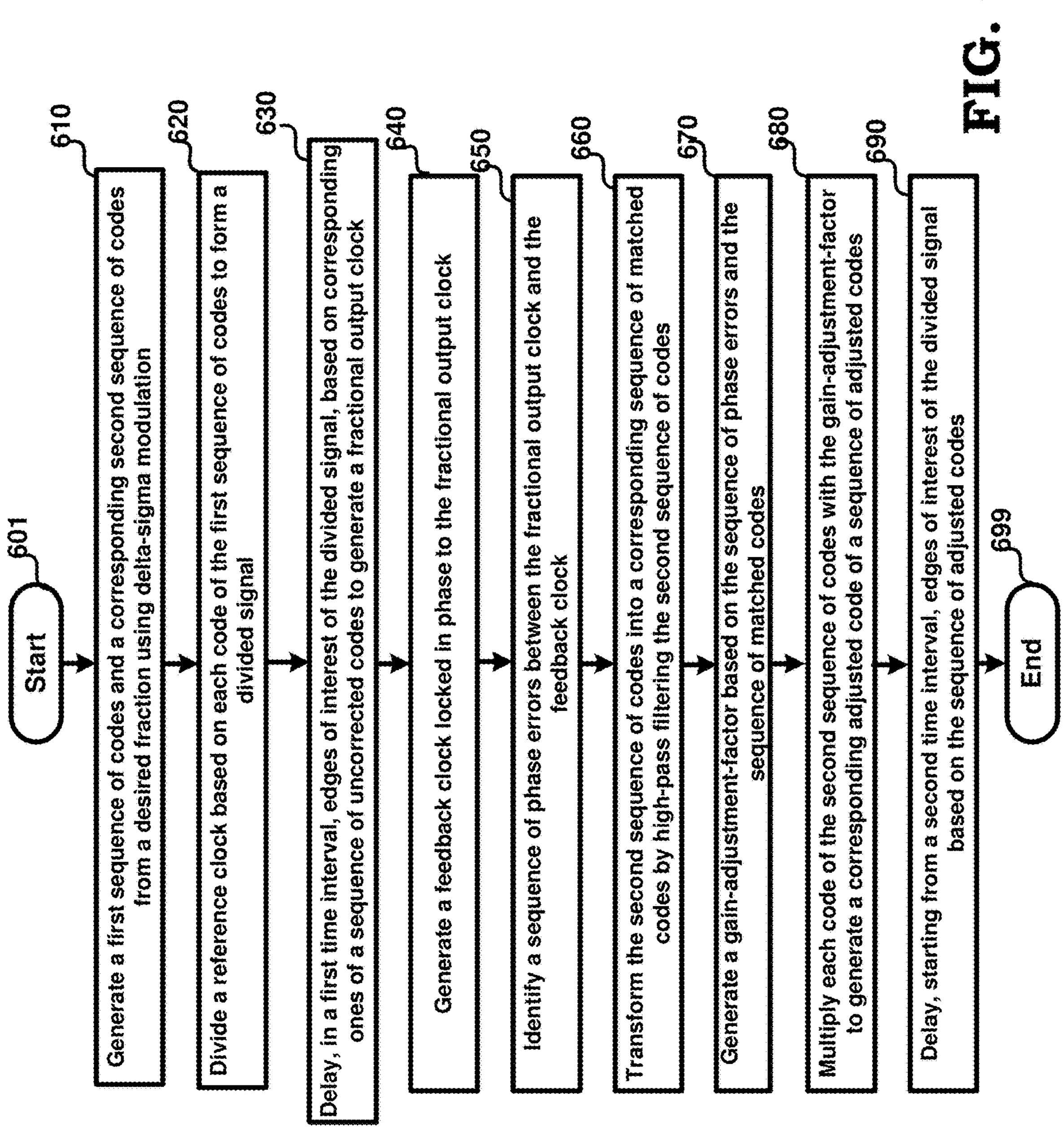
Start
601
610
Generate a first sequence of codes and a corresponding second sequence of codes from a desired fraction using delta-sigma modulation
620
Divide a reference clock based on each code of the first sequence of codes to form a divided signal
630
Delay, in a first time interval, edges of interest of the divided signal, based on corresponding ones of a sequence of uncorrected codes to generate a fractional output clock
640
Generate a feedback clock locked in phase to the fractional output clock
650
Identify a sequence of phase errors between the fractional output clock and the feedback clock
660
Transform the second sequence of codes into a corresponding sequence of matched codes by high-pass filtering the second sequence of codes
670
Generate a gain-adjustment-factor based on the sequence of phase errors and the sequence of matched codes
680
Multiply each code of the second sequence of codes with the gain-adjustment-factor to generate a corresponding adjusted code of a sequence of adjusted codes
690
Delay, starting from a second time interval, edges of interest of the divided signal based on the sequence of adjusted codes
699
End
FIG. 6

GAIN CALIBRATION OF DIGITAL-TO-TIME CONVERTER (DTC) USED IN FRACTIONAL FREQUENCY DIVIDERS

PRIORITY CLAIM

The instant patent application is related to and claims priority from the co-pending India provisional patent application entitled, "PLL based DTC Calibration in Low Jitter Fractional Frequency Dividers", Serial No.: 202441029280, Filed: 10 Apr. 2024, AURA-359-INPR, which is incorporated in its entirety herewith to the extent not inconsistent with the description herein.

BACKGROUND

Technical Field

Embodiments of the present disclosure relate generally to digital-to-time converters (DTCs), and more specifically to gain calibration of DTCs used in fractional frequency dividers, etc.

Related Art

A fractional frequency divider refers to a component that generates a fractional output clock having a frequency that is a desired fraction of a reference clock. The desired fraction can have an integer component and a fractional component, as is well known in the relevant arts.

Digital-to-time converters (DTCs) are generally used to generate an output signal having a corresponding edge delayed from that of an input clock signal by a magnitude specified by an input digital code. DTCs find use in fractional frequency dividers as well as other electronic devices such as sampling oscilloscopes, direct digital frequency synthesis, etc., as is well known in the relevant arts.

Ideally, the delay generated for a full-scale value of the input digital code should equal the maximum possible delay for which the DTC is designed. However, in certain real-world scenarios, the actual delay value generated for the full-scale value of the input digital code may deviate from the ideal value due to reasons such as process, operating voltage and temperature (PVT) variations, etc., as is well known in the relevant arts. The difference between the ideal delay and the actual delay value generated for the full-scale value is termed as 'gain-error' of the DTC. Calibration of gain refers to determining the gain-error such that appropriate corrections may be made so as to offset (cancel) the gain-error.

Aspects of the present disclosure are directed to gain calibration of DTCs used in fractional frequency dividers.

BRIEF DESCRIPTION OF THE VIEWS OF DRAWINGS

Example embodiments of the present disclosure will be described with reference to the accompanying drawings briefly described below.

FIG. 6 is a flow-chart illustrating the manner in which gain of a DTC is calibrated in an embodiment of the present disclosure.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
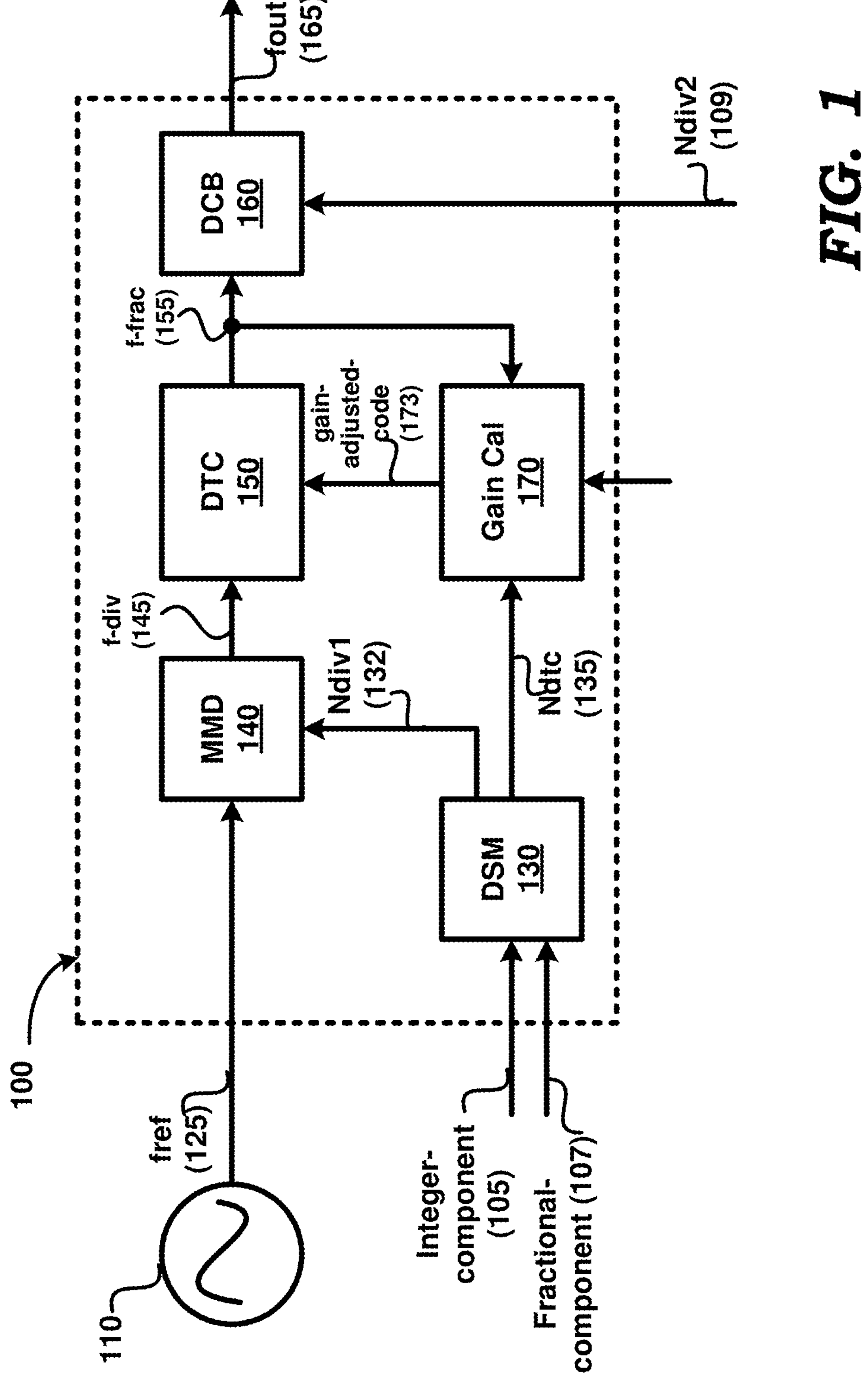
FIG. 1 is a block diagram of an example device in which several aspects of the present disclosure can be implemented.

Aspects of the present disclosure are directed to an open-loop modulator (OLM) circuit generating a fractional output clock having a frequency which is a desired fraction of that of a reference clock, wherein the desired fraction comprises an integer component and a fractional component. The OLM circuit contains a delta-sigma modulator (DSM) constituted of a first portion to generate a first sequence of codes from the integer component, and a second portion to generate a corresponding second sequence of codes from the fractional component, wherein the first sequence of codes comprises a set of a lower value and a set of a higher value together representing the desired fraction on average.

A first divider of the OLM circuit generates a divided signal having a period that is a multiple of the period of the reference clock from the reference clock and each code of the first sequence of codes, wherein the multiple is each code. A digital-to-time converter (DTC) of the OLM circuit generates the fractional output clock from the divided signal, with the DTC having a gain-error. In generating the fractional output clock, the DTC operates to delay an edge of interest of the divided signal by a time duration indicated by a corresponding adjusted code of a sequence of adjusted codes.

A DTC-gain calibration circuit of the OLM circuit generates the sequence of adjusted codes, with the DTC-gain calibration circuit containing a calibration phase-locked loop (PLL) that receives the fractional output clock as a reference clock and generates a feedback clock. A phase detector of the DTC-gain calibration circuit generates a sequence of error signals representing phase error between the fractional output clock and the feedback clock, the sequence of error signals indicative of the gain-error.

According to an aspect, a matching block of the DTC-gain calibration circuit generates a corresponding sequence of matched codes from the second sequence of codes. A first multiplier of the DTC-gain calibration circuit generates a product of corresponding ones of the sequence of matched codes and the sequence of the error signals as a sequence of first-multiplier outputs. A gain-adjustment-factor generator of the DTC-gain calibration circuit generates a gain-adjustment-factor from the sequence of first-multiplier outputs, the gain-adjustment-factor representing an inverse of a magnitude of a gain provided by the DTC. A second multiplier of the DTC-gain calibration circuit multiplies each code of the second sequence of codes with the gain-adjustment-factor to generate the sequence of adjusted codes.

According to an aspect, the signal transfer function of the combination of the second portion of the DSM and the matching block is matched with the signal transfer function of the combination of the calibration PLL and the phase detector.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

FIG. 1 is a diagram illustrating the details of an example device in which several aspects of the present disclosure can be implemented. FIG. 1 depicts an open-loop-modulator (OLM) 100 (also known as Open Loop Fractional Divider or Fractional Frequency Divider) implemented according to aspects of the present disclosure. OLM 100 generates output clock fout on path 165 from reference clock ‘fref’ received on path 125, and is shown containing delta-sigma modulator (DSM) 130, multi-modulus divider (MMD) 140, digital-to-time converter (DTC) 150, duty cycle block (160) and gain calibration circuit (gain cal) 170. It is noted herein that only components as relevant to the understanding of the disclosure are depicted in FIG. 1. It is understood that OLM 100 can contain more or fewer blocks than those shown in FIG. 1. Although the illustrative embodiment depicts an open-loop modulator, aspects of the present disclosure can be equally applied to closed-loop fractional dividers, as will be apparent to a skilled practitioner by reading the disclosure herein.

Reference clock fref (125) may be generated by a phase-locked loop (PLL), oscillator, etc. In an embodiment, PLL 110 generates reference clock fref (125) and can be implemented in a known way.

DSM 130 receives a desired ‘fraction’ (‘divide value’) in the form of integer-component 105 and fractional-component 107, and generates a sequence of correlated code pairs on Ndiv1 132 and Ndtc 135, in a known way. The first value of the pair is an integer and the second value of the pair indicates a desired delay, which in combination realizes the desired fractional output clock on fout 165. As an example, for a fraction 4.25 containing integer component of ‘4’ and fractional component of −0.25, a (repetitive) sequence of digits 4, 4, 4, and 5 (averaging 4.25) are sent on Ndiv1 (132), while a sequence of delay values ¼, 2/4, ¾ and 0 are sent on Ndtc (135). It is noted herein that multiple repetitions of the same value are described as a ‘set’ in the following description. As described below, fout 165 (f-frac 155) is generated with a period of 4.25 times that of fref 125. dsm_carry (133) is at 1 when the higher values (5) are transmitted on Ndiv1 (132) and at 0 otherwise. In an embodiment, DSM 130 is implemented as described below with reference to FIG. 3A.

Figure 2:
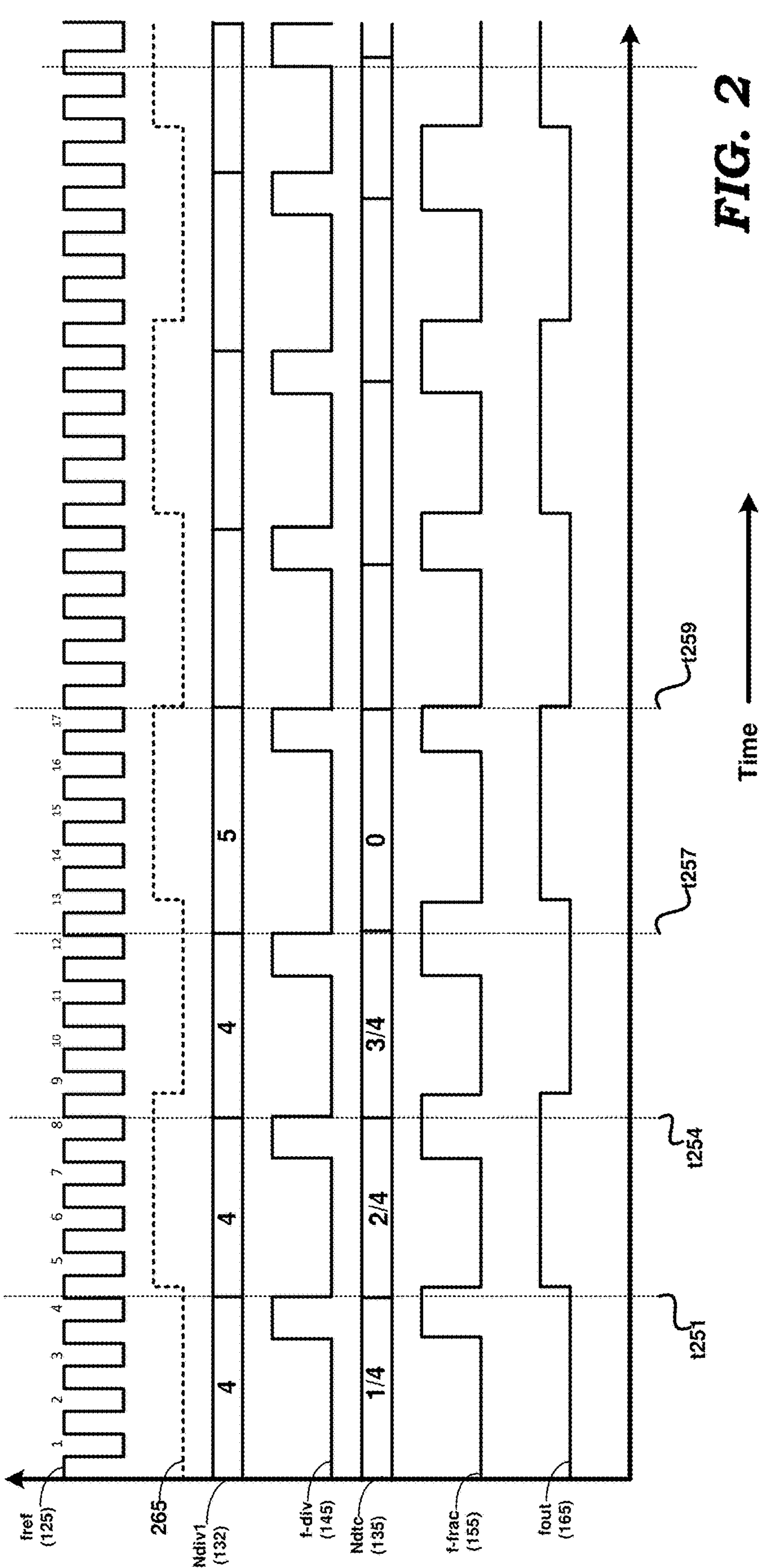
FIG. 2 is a timing diagram (not to scale) illustrating waveforms generated at various nodes of an open-loop-modulator (OLM).

MMD 140 receives reference clock fref on path 125 and code Ndiv1 on path 132, and generates divided clock f-div on path 145 according to each received code Ndiv1 (132). Ndiv1 is a repeating sequence of divisors (4, 4, 4 and 5 as in the example noted above). MMD 140 is a frequency divider that divides the frequency of fref by the corresponding divisor received on path 132 in a corresponding interval, as illustrated in FIG. 2. Code Ndiv1 (132) contains a set of a lower value (4 in the above example) and a set of a higher value (5) resulting in corresponding lower and higher time periods of f-div (145) such that the average period of f-div (145) equals the time period of desired fractional clock. MMD 140 can be implemented in a known way.

DTC 150 delays each falling (or rising) edge of divided clock f-div on path 145 by a time duration that is indicated/represented by a corresponding gain-adjusted-code received on path 173 to generate fractional output f-frac on path 155. As is well-known in the relevant arts, the frequency of divided clock f-div is not constant, and changes whenever the value of Ndiv1 changes. DTC 150 operates to delay edges of interest (falling edges in the examples noted herein) of output clock f-div according to the digital values received on Ndtc. The effect of the delays caused by DTC 150 is to generate f-frac with falling edges such that the intervals between successive falling edges are all equal and half the period of the desired output clock fout (165).

Duty Cycle Block (DCB) 160 generates output clock fout on path 165 with a desired duty cycle (specified by value of Ndiv2, 109) corresponding to clock f_frac received on path 155. In general, DCB 160 operates as a divider block that divides frequency of f-frac (155) by an even number for obtaining the 50% duty cycle, and integer component (105) and fractional component (107) are accordingly scaled down. DCB 160 can be implemented in a known way.

Gain of a DTC may be defined as the ratio of the delay and the corresponding code. Ideally, the delay generated by DTC 150 for an Ndtc code value of ‘0000’ should be zero and the delay for the full-scale (largest) value of Ndtc code should equal the largest delay that can be obtained using the DTC. The gain of DTC 150 in the ideal situation noted above can be taken to be one (i.e., ideal gain=1). In the environment of FIG. 1, the largest delay is designed to to be equal to one period of fref. Gain of a DTC is usually expressed as a percentage of the ideal full-scale range or alternatively in terms of the least significant bit (LSB), as is well known in the relevant arts. The values of Ndtc (135) generated by DSM 130 are designed for a known (the ‘ideal’) gain of DTC 150 that is determined by its design. However, in certain real-world scenarios, the actual delay values generated by DTC 150 may deviate from the ideal values (per design) due to reasons such as manufacturing process variations, operating voltage and temperature (PVT) variations, etc., as is well known in the relevant arts. In general, assuming no other error-types (e.g., offset error) present, gain-error may be defined as the difference between the ideal delay for the full-scale value of Ndtc and the actual delay value generated by DTC 150 for the full-scale/maximum value of the input code as a percentage of the ideal delay. Thus, for example, for a −20% gain-error, the actual delay provided for the maximum value of input digital code is 20% less than the ideal delay for the maximum input code. If the ideal gain is represented as 1, the actual (non-ideal) gain would be 0.8 when the gain-error is −20%.

Alternatively, DTC 150 may itself be free of gain-error, but error(s) in fref (such as, for example, frequency-error and jitter) can manifest as gain-error in DTC 150. Further still, DTC 150 can have an inherent gain-error in addition to errors in fref. The 'effective gain-error' that is sought to be cancelled according to aspects of the present disclosure is the sum of all such errors. However, in the description below, it is assumed for ease of description that only DTC 150 is the source of the gain-error.

Gain-error in DTC 150 may result in unacceptable jitter in signal f_frac (155) which propagates to output clock fout of OLM 100. Calibration of gain refers to determining the gain-error such that appropriate corrections may be made so as to offset (cancel) the gain-error.

DTC 150 is assumed to have a non-zero gain-error, and accordingly the gain of DTC 150 is not equal to '1'. Gain cal 170 operates to calibrate the gain of DTC 150 by determining the gain-error, and generates a sequence of gain-adjusted-codes on path 173 based on such determined gain-error. DTC 150 operates to delay each falling edge of signal f-frac (155) by a magnitude as specified by the corresponding gain-adjusted-code (instead of raw Ndtc codes generated by DSM). In other words, if the gain-error causes DTC 150 to generate more delay than the ideal delay for a given Ndtc code, then gain-adjusted-codes have magnitudes correspondingly less than the corresponding raw Ndtc codes by an amount such that the corresponding falling edge of f-frac is correctly placed to generate equidistant falling edges of f-frac. Conversely, if the gain-error causes DTC 150 to generate lesser than ideal delay for a given Ndtc code, then gain-adjusted-code is of a magnitude greater than Ndtc code by an amount such that the corresponding falling edge of f-frac is correctly placed. The ideal waveforms (when DTC 150 does not have a gain-error) are illustrated next.

FIG. 2 is a timing diagram (not to scale) illustrating waveforms generated at various nodes of OLM 100 assuming a fraction of 8.5 and that DCB 160 is designed to divide by 2. Thus, Ndiv1 132 is shown with a divisor equal to individual codes of repetitive sequence 4, 4, 4 and 5 respectively, and Ndtc 135 is shown with correlated codes of ¼, 2/4, ¾ and 0. f-div 145 represents the corresponding divided clock generated by dividing fref (125) with the codes received on Ndiv1 (132), with time period of f-div (145) corresponding to Ndiv1 (132) codes as depicted at time instances t251, t254, t257 and t259. Waveform f-frac (155) depicts the falling edges of f-div (145) delayed by a duration specified by Ndtc 135. Waveform fout 165 depicts the desired output signal with 50% duty cycle, obtained by dividing frequency of f-frac (155) by 2.

The description is continued to illustrate the implementation details of a DSM in an embodiment of the present disclosure.

3. Delta-Sigma Modulator

Figure 3A:
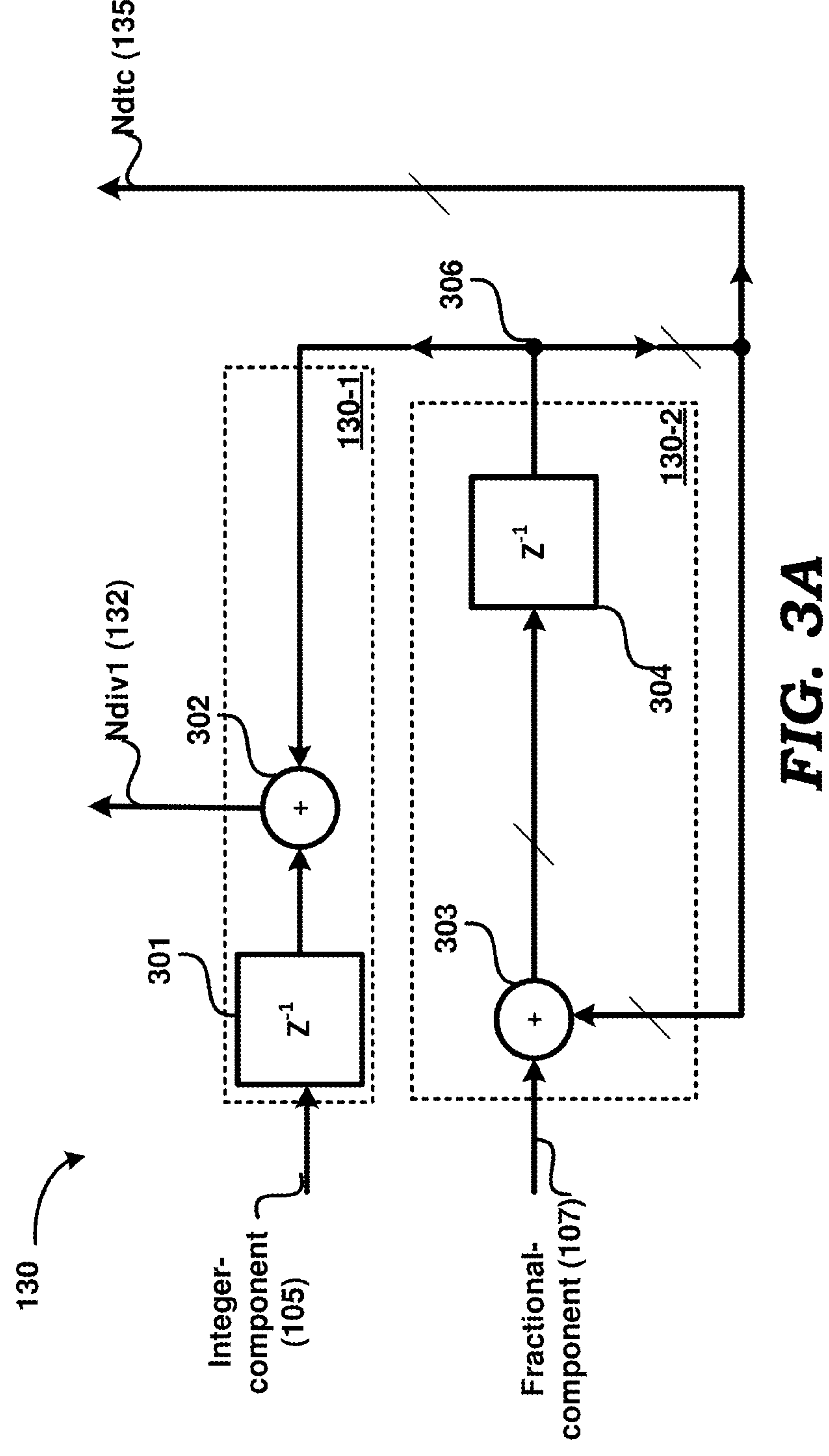
FIG. 3A is a diagram illustrating the implementation details of a Delta-Sigma Modulator (DSM), in an embodiment of the present disclosure.

FIG. 3A is a diagram illustrating the implementation details of a delta-sigma modulator (DSM) in an embodiment of the present disclosure. DSM 130 is shown containing a first circuit portion 130-1 and a second circuit portion 130-2. In the embodiment, DSM 130 is implemented as a first-order (multi-stage noise shaping/MASH-1) delta-sigma modulator. Although the illustrative embodiment depicts a first-order delta-sigma modulator, aspects of the present disclosure are equally applicable to delta-sigma modulators of higher orders, as will be apparent to a skilled practitioner by reading the disclosure herein.

First circuit portion 130-1 generates the sequence of Ndiv1 values on path 132, and is shown containing delay-element 301 and adder 302 (together operating to accumulate integer-component 105).

Second circuit portion 130-2 generates the sequence of Ndtc values (residual errors) on path 135, and is shown containing delay-element 304 and adder 303 (together operating to accumulate fractional-component 107). Carry of value '1' is generated on path 306 when accumulator in 130-2 reaches full-scale value. Ndtc codes thus contain a repetitive sequence of values (cycles), the sequence starting with magnitude of numerator of fractional-component and ending with nearest full-scale value, before rolling over to the numerator for the next cycle. Delay-elements 301 and 304 operate to generate one-sample delay corresponding to one clock cycle of f-div (145). In other words, though not shown in FIG. 3A, delay-elements 301 and 304 are clocked by falling edges of f-div (145).

As noted above, each Ndiv value indicates an integer (by which frequency of f-ref needs to be divided) and the corresponding Ndtc value indicates a desired delay, which in combination cause OLM 100 to generate the desired fractional output clock. The description is continued to illustrate the implementation details of a gain calibration circuit according to aspects of the present disclosure.

4. Gain Calibration Circuit

Figure 3B:
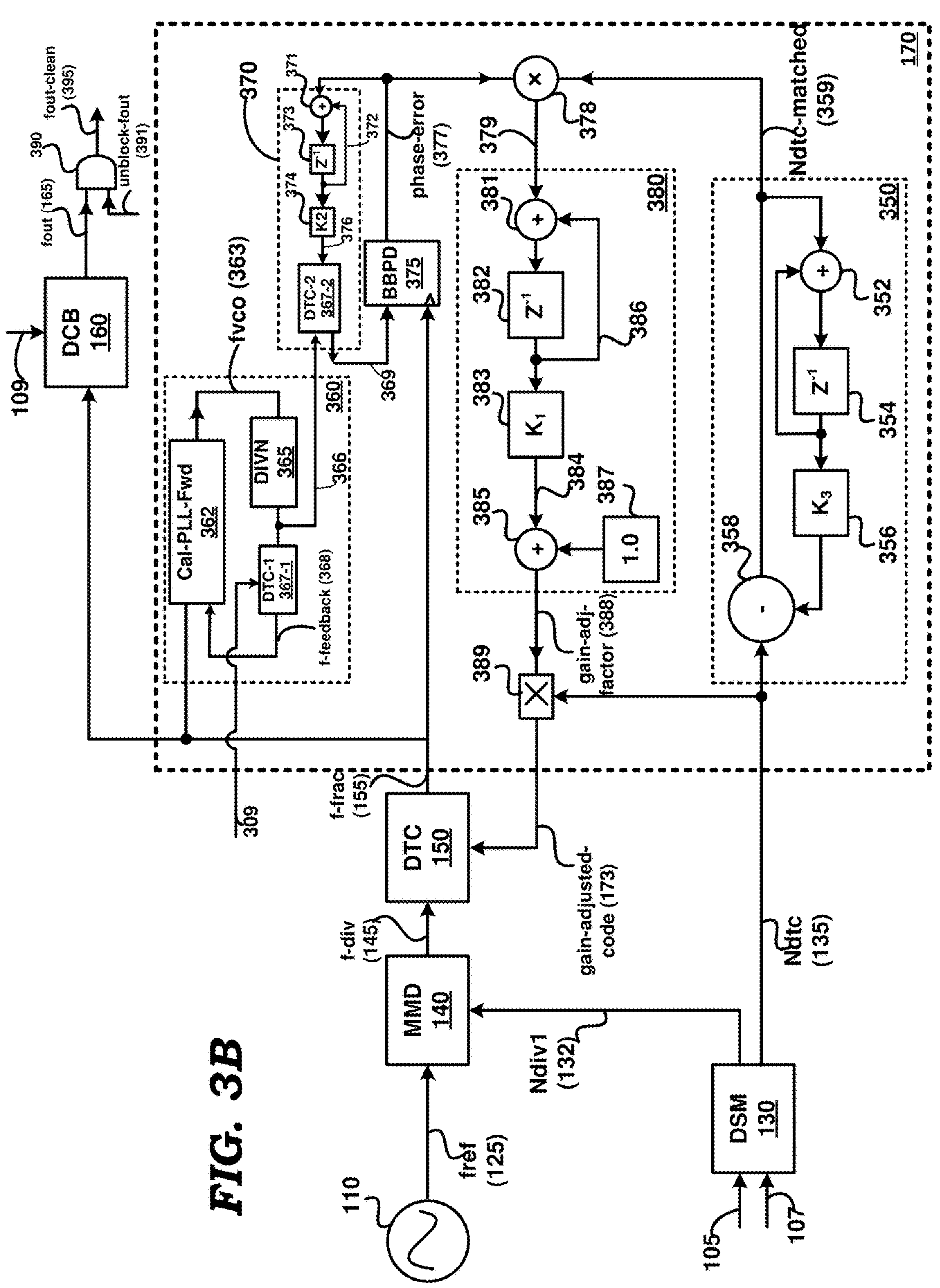
FIG. 3B is a diagram illustrating the implementation details of a (Digital-to-Time Converter) DTC gain calibration circuit, in an embodiment of the present disclosure.

FIG. 3B is a block diagram illustrating implementation details of a gain calibration circuit 170 for DTC 150 in an embodiment of the present disclosure, along with the associated components of OLM 100. FIG. 3B is shown containing phase locked loop (PLL) 110, MMD 140, DTC 150, DSM 130, DCB 160, gain cal 170 (all of FIG. 1) and AND gate 390. Gain cal 170 in turn is shown containing calibration PLL (cal-PLL 360, containing cal-PLL-Fwd block 362 in the forward path, frequency divider DIVN block 365 and offset-correction DTC (DTC-1, 367-1) in the feedback path), offset-correction block 370, bang-bang phase detector (BBPD) 375, correlator 378, circuit 380, multiplier block 389 and matching block 350. It is noted herein that only components as relevant to the understanding of the disclosure are depicted in FIG. 3B. It is understood that gain cal 170 can contain more or fewer blocks than those shown in FIG. 3B. Although not indicated in FIG. 3B, several of the digital blocks shown in the figure may be clocked by corresponding clocks and operate synchronous to the respective clock. For example, DSM 130, blocks 350, 370 and 380 and multiplier 378 may be clocked by f-div (145).

As noted above, DTC 150 is assumed to have a non-zero gain-error, and accordingly the gain of DTC 150 is not equal to '1'. Gain cal 170 operates to determine the gain-error of DTC 150, and generates a sequence of gain-adjusted-codes on path 173 based on such determined value.

Specifically, cal-PLL 360 operates to detect residue phase error in signal f-frac introduced due to the gain-error of DTC 150. BBPD 375 and correlator 378 (which is simply a multiplier in this example) operate to capture Ndtc code-dependent residue phase error in signal f-frac. Digital integrator (circuit 380) is employed to accumulate multiplier output (379), and each Ndtc code is adjusted in negative feedback to cancel the gain-error. The components of gain cal 170 are described in detail next.

In an embodiment, cal-PLL 360 is implemented as a ring-oscillator (RO)-based analog PLL. RO-PLL 360 is a low-power, low-area, integer-mode-only PLL in the embodiment. Bandwidth (BW) of RO-PLL is configurable based on desired operating frequency ranges of fref (125), fout (165) and f-frac (155), the fraction(s) to be realized, etc. Though not shown in FIG. 3B, cal-PLL-Fwd block 362 internally co a phase detector (PD) block, a charge pump (CP), a low-pass filter (LPF) and a ring-oscillator. The BW of cal-PLL may be varied by varying current of the CP and/or by varying LPF elements (such as, for example, resistor (R) and capacitor (C) values of an RC-LPF).

Cal-PLL 360 receives f-frac as an input and generates fvco (353) locked in phase and frequency to f-frac and having a frequency that is a multiple of f-frac, with the divide-ratio of divider DIVN (365) determining the value of the multiple. Signal f-feedback (368) represents the feedback clock provided as the second input to the phase detector in cal-PLL, f-frac being the first input. The phase detector inside cal-PLL-Fwd operates to determine phase difference based on the falling edges of f-frac and f-feedback (368).

Assuming no gain-error in DTC 150, in the steady-state of operation, there would ideally be zero phase difference between falling edges of f-frac and f-feedback (368) because all falling edges of f-frac would occur exactly periodically. Further, even if gain-error is present, once gain cal 170 has settled and provides the correct correction-factor on path 388 (gain-adj-factor), f-frac would not contain any gain-errors, and again there would be zero phase difference between falling edges of f-frac and f-feedback (368).

However, when a gain-error exists, the falling edges of f-frac are not perfectly periodic. The delay-error in a falling edge is proportional to the gain-error and the corresponding Ndtc value. Consequently, there would be corresponding phase errors between at least most of the falling edges of f-frac and the corresponding falling edges of f-feedback. The bandwidth of cal-PLL determines how closely cal-PLL's output fvco (and therefore f-feedback) would track f-frac, and hence the specific stream of values of phase error (377) generated by BBPD (described below).

In an embodiment of the present disclosure, OLM 100 is implemented without blocks 367-1 and 370. In such an embodiment, output of DIVN (365) on path 366 is provided as the feedback clock (on path 368) to cal-PLL-Fwd and also provided as input (on path 369) to BBPD 375.

In an alternative embodiment of the present disclosure, OLM 100 is implemented to include blocks 367-1 and 370 (as depicted in FIG. 3B) to improve performance of gain calibration circuit 170. Specifically, offset-correction block 370 and DTC-1 (367-1), operate to cancel offset (that introduces a relative delay between the two input signals of BBPD), if any, that may manifest on the input paths to BBPD 375 due to reasons such as different routing delays, element mismatches between the circuits inside BBPD 375 that are connected to the two inputs of BBPD 375, etc.

In order to correct the offset noted above, a pair of identical DTCs (DTC-1, 367-1 and DTC-2, 367-2) is employed, each to delay the falling edges of the output clock of DIVN 365. Both DTCs have the same total delay range that they can provide, and receive divided clock signal on path 366 as input. However, in alternative embodiments, the DTCs may have different delay ranges, and need not be identical. DTC-1 operates to provide a fixed delay (indicated by digital code received on path 309) to corresponding edges of divided clock 366, while DTC-2 is continuously controlled by other blocks inside block 370 in negative feedback closed loop such that, under steady-state operation, blocks 367-1 and 370 together cancel the offset. A brief description of offset cancellation is provided below.

Offset error could be a positive value or a negative value. In order to enable cancellation of positive as well as negative offset error, DTC-1 (367-1) is used in addition to DTC-2. DTC-1 is placed in the feedback path of cal-PLL 360. Prior to first-time operation of the offset correction circuits, DTC-1 is configured to provide a delay equal to half the maximum delay that DTC-1 can provide, and thus is initialized by a digital code (received on path 309) equal to FS/2 (half the full-scale code). With this initial setting, and with the condition that DTC-1 and DTC-2 are identical (or at least that the range of delays that they can provide is the same), the offset correction loop formed by block 370 and BBPD 375 can operate to correct for an offset error of magnitude and sign in the range −X to +X, wherein X represents an offset error magnitude equal to a delay duration that is provided by either DTC in response to a digital code FS/2. Thus, when the offset correction loop achieves steady-state when the final code on path 376 is in the interval 0 to FS/2], then the corrected offset error lies in the range 0 to −X. On the other hand, when the offset correction loop achieves steady-state when the final code on path 376 is in the closed interval [FS/2 to FS], then the corrected offset error lies in the range 0 to +X.

To speed-up the offset-correction, the next time OLM 100 powers-up or is released from a RESET, final code 376 is employed to determine initialization codes for one or both of the DTCs. For example, if the final code 376 was greater than 0 but less than FS/2, then DTC-1 is initialized to a delay with a code having a magnitude equal to (FS/2-final code 376). This ensures very quick or immediate settling of the offset correction loop, since its required final code 376 would be a 0. The steady-state magnitude of final code 376 is stored in a memory (not shown in FIG. 3B) in OLM 100, and is read from memory in a known way for determining initialization codes noted above.

On the other hand, if final code 376 was greater than FS/2 but less than FS, then DTC-1 is initialized to a delay with a code having a magnitude equal to 0 (i.e., no delay). This ensures relatively faster settling of the offset correction loop, since its required final code 376 would be (final code 376-FS/2) rather than the value that is greater than FS/2.

However, when the steady-state value of the code on path 376 is either 0 or FS, a residual offset error may still remain. An aspect of the present disclosure enables correction of such residual error also, i.e., allows for an offset correction range [−FS to +FS], rather than only [−FS/2 to +FS/2] in the description above. The technique to enable an offset correction range of ±FS is described below:

A) If final code 376 is FS: DTC-1 is initialized to a delay of 0, and the offset correction loop is allowed to operate. DTC-2 may reach steady-state for a delay corresponding to a code in the closed interval [0 to FS].

B) If final code 376 is 0: DTC-1 is initialized to a code of FS, and the offset correction loop is allowed to operate. DTC-2 may reach steady-state for a delay corresponding to a code in the closed interval [0 to FS].

Case (A) above covers an offset error interval of 0 to FS, and case (B) above covers an offset error interval of 0 to (−FS).

Offset-correction block 370 contains adder 371, delay block 373, scaling block 374 and offset-correction DTC (DTC-2, 367-2). Adder 371 adds the values on paths 377 and 372. Delay block 373 generates a delay of one sample duration. Adder 371 and delay block 373 together operate to perform integration (accumulation or low-pass filtering) of the phase-error values received on path 377, and may together be referred to as an 'accumulator'. The accumulated (or low-pass filtered) value on path 372 is multiplied in block 374 by a scaling factor 'K2' to generate a scaled average on path 376. Scaled average 376 is then provided as a digital code to DTC-2 (367-2) to delay the falling edges of divided clock 366 on path 369.

BBPD 375, which may be implemented as a negative-edge-triggered D-flip-flop, receives offset-corrected feedback clock (on path 369) on its data (D) input and f-frac on its clock input (negative edge-triggered in the example herein). BBPD generates a phase-error signal on path 377, indicating whether the phase difference between corresponding falling (negative) edges of f-frac and offset-corrected feedback clock (369) is positive or negative at corresponding time points (negative edges of f-frac). In the embodiment, a value of '+1' indicates a positive phase error (negative edge of f-frac lags corresponding negative edge of offset-corrected feedback clock) while a value of '−1' indicates a negative phase error (negative edge of f-frac leads corresponding negative edge of offset-corrected feedback clock). Once gain cal 170 reaches steady-state (gain-adj-factor has converged to the correct value needed to cancel the gain-error, and no gain-error manifests in f-frac), phase-error signal 377 randomly dithers between positive and negative values, predominantly due to circuit noise, such that the average value over time of phase-error signal 377 is zero. Therefore, values on path 379 will also randomly change between corresponding positive and negative values, which when averaged by blocks 381 and 382, would not further affect the steady-state value of signal 384.

Prior to reaching the steady-state, DTC 150 would operate to delay the falling edges of f-frac by time durations indicated by corresponding 'uncalibrated' Ndtc codes.

Correlator 378 multiplies phase-error signal (+1 or −1 values) received on path 377 with the corresponding Ndtc-matched code received on path 359, and generates a correlator-output on path 379. Correlator 378 may be implemented in a known way. In an embodiment, block 378 is implemented to perform multiplication of signals 377 and 359 to generate a corresponding product (379).

Circuit 380 contains adder 381, delay block 382, scaling block 383, adder 385 and offset block 387. Adder 381 adds the values on paths 379 and 386. Delay block 381 generates a delay of one sample duration. Adder 381 and delay block 381 together operate to perform integration (accumulation or low-pass filtering) of the products received on path 379, and may together be referred to as an 'accumulator'. The combination of multiplier 378 and the accumulator represents a correlator. The accumulated output is provided on path 386. Thus, a magnitude of signal 386 indicates similarity (or non-similarity) of signals 377 and 359, with a larger magnitude indicating higher similarity.

The accumulated (or low-pass filtered) value on path 386 is multiplied in block 383 by a scaling factor 'K1' to generate a scaled average on path 384. Scaled average 384 is then added by adder 385 to an offset value of '1' received from block 387 to generate 'gain-adj-factor' on path 388.

Multiplier 389 multiplies each 'raw' Ndtc code (135) by the gain-adj-factor (388) to generate gain-adjusted-codes on path 173, which are then used by DTC 150 to delay the corresponding falling edge of f-frac by the duration 'indicated' by the gain-adjusted code. The 'main feedback loop' represented by the path formed by cal-PLL 360, BBPD 375, multiplier 378 and circuit 380 represents the main portion of gain cal 170. When the main feedback loop reaches steady-state, gain-adj-factor (388) converges to the correct value needed to cancel the gain-error of DTC 150. That is, steady-state value of gain-adj-factor represents the value by which each Ndtc code needs to be multiplied so as to cancel (offset) the gain-error of DTC 150.

The steady-state value of gain-adj-factor equals an inverse of the actual gain provided by DTC 150 when gain-correction is not employed. For example, assuming that the gain of DTC 150 equals '1.2' (+20% FSR gain-error), the gain-error equals '+0.2'. Accordingly, scaled average value (384) converges to '−0.2' in steady-state, resulting in a gain-adj-factor of '1 plus (−0.2)'=0.8. Thus, each Ndtc code is multiplied (pre-scaled) by '0.8' (which is equal to 1/1.2, the inverse of gain of DTC 150) to generate respective gain-adjusted-codes on path 173. The bandwidth of circuit 380 may be configured to have a relatively higher value at the start of operation of OLM 100 to enable faster settling time, and may be gradually decreased (in steps or gear settings) in order to get better noise performance at steady-state.

AND gate 390 operates to block signal fout (165) from being delivered as output on path 395 until the process of gain calibration attains steady-state after start of operation of OLM 100. In an embodiment, signal unblock-fout 391 is held at logic low for a pre-determined (fixed) duration needed for gain cal 170 to reach steady-state, and is thereafter transitioned to logic high. Thus, output fout-clean (395) represents a fractional output clock that is relatively low in jitter due to cancellation of gain-error of DTC 150. The pre-determined (fixed) duration needed for gain cal 170 to reach steady-state may be obtained based testing the circuit of FIG. 3B and/or simulations, and signal unblock-fout may be generated in a known way.

Matching block 350 operates to modify each Ndtc code received on path 135 and generates a respective Ndtc-matched code on path 359 such that a shape (in time domain) of signal phase-error 377 is closer to that of Ndtc-matched codes (359) as compared to a shape (in time domain) of Ndtc codes 135. The requirement for such matching of the shapes of the waveforms is described below with reference to FIG. 4.

5. Matching Block

Figure 4:
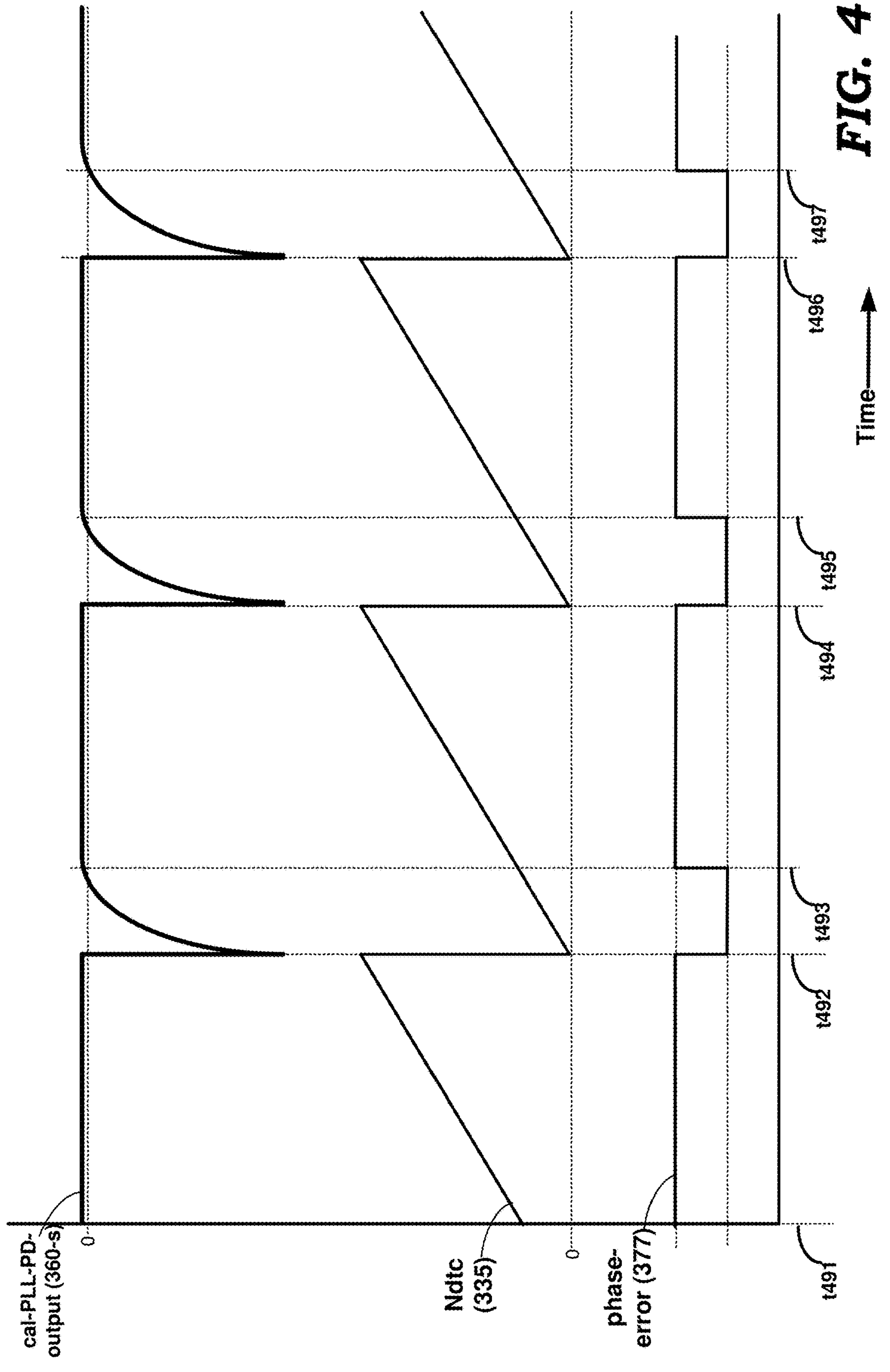
FIG. 4 is a timing diagram (not to scale) depicting the input waveforms to correlator in the absence of the claimed technique.

The need for matching block 350 is to achieve similarity in shape of the two inputs provided to multiplier 378. It can be better understood by observing the general nature ('waveform', or shape in time-domain if the magnitudes were plotted) of the two streams of input values to multiplier 378 if matching block 350 were not employed, and if Ndtc (135) were directly provided to multiplier 378. FIG. 4 (not to scale) shows the waveform representing the output of the phase detector in cal-PLL-Fwd 362 (noted in FIG. 4 as cal-PLL-PD-output (360-*s*)), and the waveforms of two inputs to multiplier 378, namely, Ndtc (335) and phase-error (377). It is noted herein that the low-pass filtered version of phase-error (by which the effects of noise are assumed to be removed) is depicted in waveform 377 in FIG. 4.

The waveform of Ndtc is a linearly increasing ramp in interval t491-t492. FIG. 2 shows an example in which the Ndtc values there linearly increase (¼, 2/4, ¾ for the example fraction of ¼ noted above) until the next code is a 0. Thereafter, the shape of Ndtc repeats in a similar ramp fashion in the following time intervals (intervals (t492-t494) and (t494-t496) are shown), and the waveform resembles a sawtooth. The waveform cal-PLL-PD-output is shown to be generally flat and constant in time interval t491 to t492. In interval t491 to t492, the rate of change of Ndtc is a constant (slope of the ramp shown in the figure) and small enough such that the changes in the phases of the falling edges of f-frac (165) lie within the bandwidth (BW) of cal-PLL, which therefore can track the changes very quickly. Consequently, the variations in cal-PLL-PD-output are very small in this region, and on an average are substantially constant/flat as shown in waveform 360-*s* in this interval. In the same interval, phase difference between inputs to BBPD 375 would be very close to zero. However, since a binary output flip-flop is used to indicate the phase difference, noise would force the output with equal probability to +1 and −1.

However, there is a sharp change in Ndtc at t492, where Ndtc equals 0 (or smallest starting value). Correspondingly, there is a large phase error between the falling edge of f-frac and f-feedback (368) at t492. The BW of cal-PLL is not large enough to track the large phase error quickly. As a result, cal-PLL-PD-output has a large magnitude and is shown as a negative dip in the waveform at t492. Thereafter, cal-PLL-PD-output reduces until, at t493, it reaches the level prior to t492. Correspondingly, in the same time interval (t492-t493), output of BBPD 375 would be '−1' indicating the phase difference sign. Thus, to a large extent, the shape of the waveform of phase-error (377) is similar to that of cal-PLL-PD-output, as depicted in FIG. 4. The duration t492-t493 is determined by the BW of cal-PLL. Thereafter (i.e., post t493), the waveforms of Ndtc and cal-PLL-PD-output follow a similar pattern as before, and repeat.

To obtain a numerical value that can be used to modify each of the Ndtc codes (135) based on the measure of the gain-error indicated by the output values of BBPD 375 and thereby cancel the gain-error, the outputs of the BBPD 375 can be correlated with a corresponding stream of values derived from the Ndtc values.

It may be appreciated that directly correlating the output values (377) generated by BBPD 375 with the corresponding values (in time) of Ndtc codes (135) may not produce a meaningful result since the shapes of the respective 'waveforms' of phase-error (377) and Ndtc (135) are quite different. Therefore, it may not be possible to obtain an accurate 'correction-factor' or a 'correction-factor' at all, to cancel the gain-error by directly correlating the two streams of values.

According to an aspect of the present disclosure, the Ndtc codes (135) are transformed into a stream of 'matched' codes (Ndtc-matched 359), and the matched codes are correlated with the values in phase-error (377).

Referring again to FIG. 3B, matching block 350 is shown containing subtractor 358, adder 352, delay block 354 and scaling block 356. The output of delay block 354 is provided as an input to both adder 352 and scaling block 356. Blocks 352 and 354 and the corresponding connections together perform low-pass filtering or accumulation of the values received from path 359. Scaling block 356 multiplies the output of block 354 by a value K3 (described further in sections below) to generate a scaled and low-pass filtered output. Subtractor 358 subtracts each Ndtc code received on path 135 by a corresponding value received from scaling block 356 to generate a matched Ndtc code on path 359. Adder 352 adds each matched Ndtc code on path 359 to a corresponding 'accumulated' code received from delay block 354. Thus, matching block 350 represents a high-pass filter (HPF).

The operation of matching block 350 transforms the shape of the waveform of Ndtc (135) into a shape closely resembling that of cal-PLL-PD-output and phase-error (377), as described next.

6. Inputs to Correlator

Figure 5:
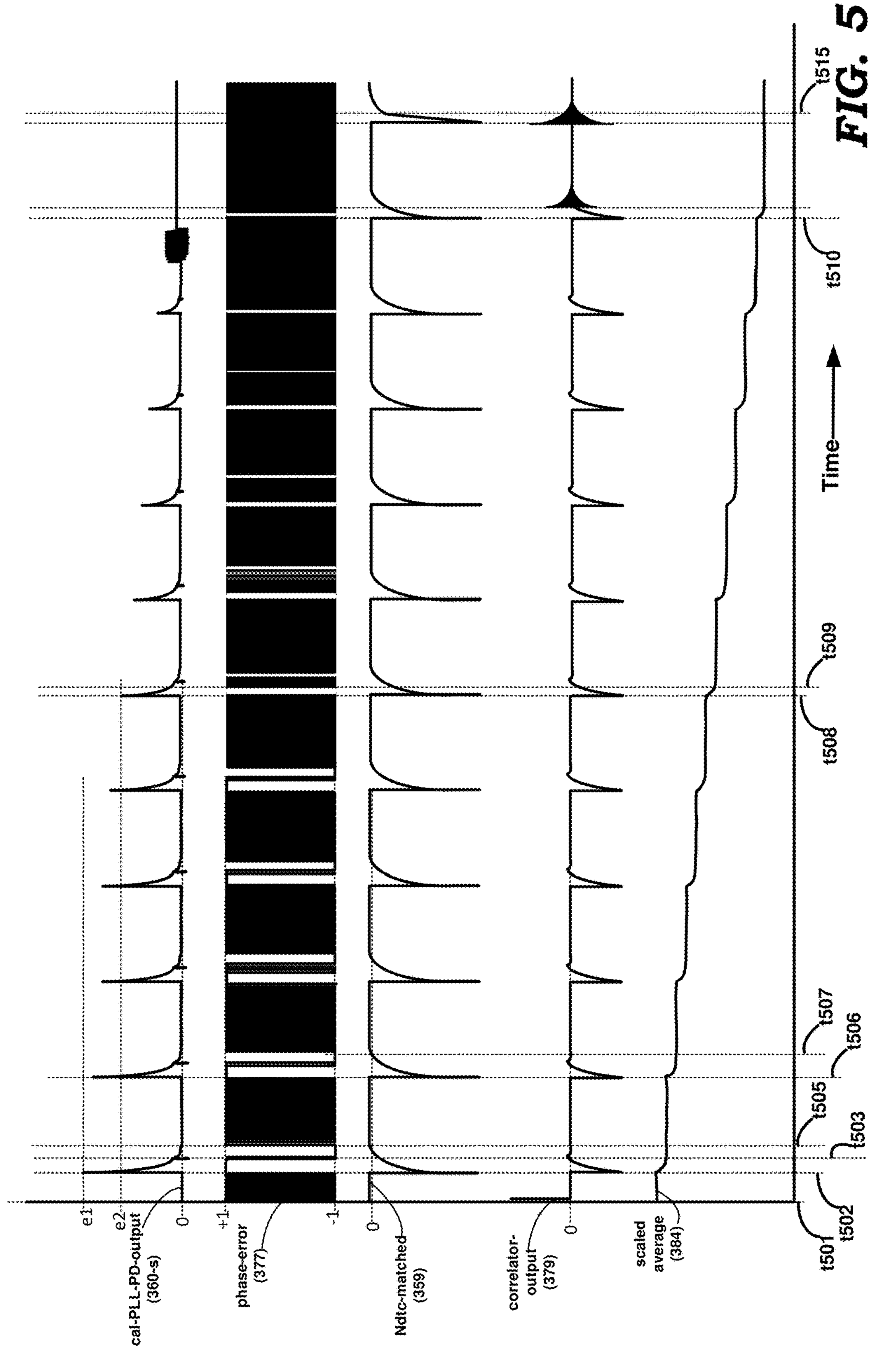
FIG. 5 is a timing diagram (not to scale) illustrating example waveforms at various nodes of the gain calibration circuit, in an embodiment of the present disclosure.

FIG. 5 is a timing diagram (not to scale) depicting example waveforms of cal-PLL-PD-output (360-*s*), phase-error (377), Ndtc-matched (359), output (379) of multiplier 378 (termed as 'correlator-output') and scaled average 384, with matching block 350 included in gain cal 170. Time interval t501-t510 depicts example waveforms prior to convergence of gain cal 170 (e.g., at start of operation of OLM 100), and time interval t510-t515 depicts example waveforms after gain cal 170 reaches steady-state.

Due to the design and operation of matching block 350, signal Ndtc-matched (359) more closely resembles (in shape) phase-error 377 and cal-PLL-PD-output 360-*s*) than Ndtc (135).

Prior to t501, it is assumed that offset-correction block 370 has reached steady-state.

The 'flat' portions of waveform Ndtc-matched (359) (e.g., time interval t505-t506) illustrate the durations in which Ndtc code (135) is increasing linearly with time. Ndtc code (135) jumps to 0 (e.g., as depicted at time instants t502, t506, t508) and Ndtc-matched correspondingly jumps to a large negative value in response to such jumps. In the 'spike' regions, (example time intervals t502-t503 and t508-t509), Ndtc-matched increases in a manner similar to cal-PLL-PD-output in the same intervals.

Prior to convergence of gain cal 170, in each cycle of Ndtc code, coincident with each jump in Ndtc code to 0, cal-PLL-PD-output has a large magnitude and is shown as a positive spike. Thereafter, cal-PLL-PD-output reduces until it reaches the level prior to the jump. Various regions/time intervals in one cycle of Ndtc are described below in detail.

For example, considering the cycle in time interval t502-t506:

- At t502: Coincident with the jump in Ndtc code to 0, cal-PLL-PD-output (360-*s*) has a positive spike (in the example embodiment) of magnitude e1.
- In time interval t502-t503: Magnitude of cal-PLL-PD-output (360-*s*) reduces (from e1) until it reaches the level prior to the jump. The time duration of t502-t503 and the slope of 360-*s* are based on the bandwidth of cal-PLL. BBPD output phase-error (377) are all '+1' values being indicative of the phase error between the inputs to the BBPD. Correlator-output (379), being the product of '+1' values on path 377 and negative values on path 359, has corresponding negative values. Scaled average (384) starts accumulating values on path 379, and has a slight dip (corresponding to the code jump).
- In time interval t503-t505: Magnitude of cal-PLL-PD-output has reached the level prior to the jump, and Ndtc-matched (359) has become flat. BBPD output phase-error (377) are all '−1' values (the number of '−1' values being approximately equal to the number of '+1' values in time interval t502-t503) due to operation of offset-correction block 370. There is no significant change in magnitude of correlator-output (379) due to '−1' values of phase-error (377) since the magnitude of Ndtc-matched (359) remains substantially constant (and close to zero) in this duration. It is noted herein that there is a time lag between the start of '+1' values region of BBPD output and the reaction of offset-correction loop, and as a result, the effect of correction of offset-correction loop is visible only after t503 and settles by t505.
- In time interval t505-t506: Magnitude of cal-PLL-PD-output remains substantially at the level prior to the jump as cal-PLL has obtained lock, and Ndtc-matched (359) is flat. BBPD output phase-error (377) randomly dithers between positive and negative values (indicated as block in FIG. 5 for ease of illustration) such that the average value in zero. Accordingly, correlator-output (379) and scaled average (384) also remain substantially constant. Although the waveform of 360-*s* is illustrated as a straight line, in reality, the value of 360-*s* will oscillate around zero value, due to noise, as will be apparent to a skilled practitioner by reading the disclosure herein.

Thereafter (i.e., in time interval t506-t510), the waveforms of cal-PLL-PD-output (360-*s*), phase-error (377), Ndtc-matched (359) and correlator-output (379) follow a similar pattern as before, and repeat, with the exception that the magnitude and width of spike in waveform 360-*s* in each cycle progressively decreases (e.g., as illustrated to be e1 at t502 and e2 at t508), as circuit 380 moves towards convergence (indicated by waveform of scaled average, 384). Correspondingly, the duration of time for which BBPD output is '+1' also decreases progressively with each cycle, as illustrated, for example, in time durations t502-t503 vs t508-t509.

At (or slightly before) t510, circuit 380 converges (reaches steady-state). Accordingly, thereafter (post t510), waveform 384 is shown to have a single steady-state value, cal-PLL-output (360-*s*) is substantially flat, and BBPD output randomly dithers between positive and negative values.

It is noted herein that the time taken for circuit 380 to converge is proportional to the magnitude of gain-error. In other words, larger the gain-error of DTC 150, longer will be the time taken for circuit 380 to converge, and vice versa.

Updates to K1 loop effectively occur only at and immediately following the code jumps to 0, while during such update intervals, the K2 loop's operation does not affect the process of calibrating gain-error due to the delayed response of K2 loop as noted above.

Correlating Ndtc-matched (359) with phase-error (377) enables the resulting correlation output on path 386 to converge to a value that can be used to correct each Ndtc code (135) so as to cancel the gain-error when the corrected codes (gain-adjusted-code (173)) are used by DTC 150 to delay the corresponding falling edges of f-frac.

According to an aspect of the present disclosure, the 'signal transfer function' (STF) of circuit portions of OLM 100 are matched in order to obtain the transformation (of Ndtc codes) noted above. As is well known in the relevant arts, the term 'signal transfer function' of a block is represented by a mathematical function that models the output of the block for each possible input, excluding the effect of noise. 'Matching' the signal transfer functions of two blocks implies that the curves/plots (amplitude of output versus input) of the blocks look similar within a threshold error range. Furthermore, in the context described herein, 'matching' is also used to mean that the shapes of two matched signals are also similar.

In an embodiment, the STF (STF-1) of the combination of circuit portion 130-2 of DSM 130 and matching block 350 is matched with the STF (STF-2) of the combination of cal-PLL (360) and BBPD 375. The combination of 130-2 and 350 is referred to as 'first block' that receives fractional-component (107) as input and generates Ndtc-matched (359) as output. The combination of 360 and 375 is referred to as 'second block' that receives time difference between f-frac (166) and f-feedback (387) as input and generates phase-error (377) as output. By matching the STFs of the two blocks, shape of waveforms Ndtc-matched and phase-error (as well as cal-PDD-PD-output) resemble more closely to each other (as shown in FIG. 5) than waveforms of Ndtc and phase-error (as shown in FIG. 4).

As part of matching STFs as noted above, BW of cal-PLL 360 is also matched (e.g., made equal) with that of matching block/HPF 350 for optimum correlation. Equivalently, the cut-off frequency of HPF 350 is matched (e.g., made equal) with the Unity Gain Frequency (UGF) of cal-PLL.

OLM 100 generally needs to be designed to support certain operating frequency ranges of clock fout (165), as is well known in the relevant arts. In an embodiment, for each certain operating frequency range of fout (165), simulations are run for corresponding possible combinations of (f-frac and Ndiv2). A value of f-frac (or correspondingly Ndiv2 value) is selected such that it is easier to match the BW of matching block 350 with BW of cal-PLL 360. For example, the number of programming bits needed to set the BW of matching block 350 and cal-PLL 360 may be kept low for easier implementation (say, 4 bits each), and divisor values of Ndiv2 are selected such that gain cal 170 converges faster. The BW configuration values of cal-PLL and gain factor K3, taking into account process corners of the integrated circuit (IC), are stored in a look-up table (LUT) for each range of fout (165), and are configured at design of OLM 100 in a known way.

As an example, assume fout=150 Mega Hertz (MHz) (a single value of fout is illustrated instead of a range for simplicity). There are at least 4 possible pairs of (f-frac, Ndiv2), i.e., (300 MHz, 2), (600 MHz, 4), (900 MHZ, 6), and (1200 MHz, 8). Simulations are run for all possible combinations noted above, and based on the simulation results, a value of f-frac is chosen such that it is easier to match BW of matching block 350 matches with cal-PLL BW. The value of f-frac and the corresponding BW values of cal-PLL and matching block 350 are stored in the LUT noted above.

The operation of OLM 100 is summarized below with reference to flow-chart of FIG. 6.

7. Flow-Chart

FIG. 6 is a flow-chart illustrating the manner in which gain of a DTC is calibrated according to aspects of the present disclosure. While the description is provided with specific examples with reference to components of FIGS. 3A and 3B, the features of the present disclosure can be employed in the corresponding circuitry/sub-systems in other component and environment without departing from the scope and spirit of various aspects of the present disclosure, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present disclosure. The flow chart begins in step 601, in which control immediately passes to step 610.

In step 610, DSM 130 generates a first sequence of codes (Ndiv1) and a corresponding second sequence of codes (Ndtc) from a desired fraction using delta-sigma modulation.

In step 620, MMD 140 divides reference clock fref (125) based on each code of the first sequence of codes to form divided signal (f-div, 145).

In step 630, in a first time interval (i.e., prior to gain cal 170 reaching the steady-state of operation), DTC 150 delays edges of interest (falling edges in the embodiment) of f-div based on corresponding ones of a sequence of uncalibrated codes to generate fractional output clock (f-frac, 155).

In step 640, cal-PLL 360 generates feedback clock (f-feedback, 368) locked in phase to f-frac.

In step 650, BBPD 375 identifies a sequence of phase errors (377) between f-frac and f-feedback.

In step 660, matching block 350 transforms the raw Ndtc codes (135) into a corresponding sequence of matched codes (359) by high-pass filtering the raw Ndtc codes. In an embodiment, the signal transfer function (STF) of the combination of circuit portion 130-2 of DSM 130 and matching block 350 is matched with that of the combination of cal-PLL 360 and BBPD 375. As part of matching STFs as noted above, BW of cal-PLL 360 is also matched (e.g., made equal) with that of matching block/HPF 350 for optimum correlation. Equivalently, the cut-off frequency of HPF 350 is matched (e.g., made equal) with the Unity Gain Frequency (UGF) of cal-PLL 360.

In step 670, circuit 380 generates a gain-adjustment-factor (388) based on the sequence of phase errors and the sequence of matched codes. Specifically, multiplier 378 multiplies each phase error of the sequence of phase errors with a corresponding one of the sequence of matched codes. Accumulator (constituted of adder 381 and delay block 382) low-pass filters the sequence of products (379) and block 383 scales the filtered output. Adder 385 adds the scaled value with a fixed offset value provided by offset block 387 to generate gain-adjustment-factor (388). Gain-adjustment-factor (388) converges to a value that equals an inverse of a magnitude of a gain provided by DTC at the end of said first time interval (i.e., upon block 170 attaining steady-state).

In step 680, multiplier 389 multiplies each raw Ndtc code with gain-adjustment-factor to generate a corresponding adjusted code (173).

In step 690, from the start of a second time interval (steady-state operation), DTC 150 delays the falling edges of f-div according to the adjusted codes received on path 173. The flow-chart ends in step 699.

In this manner, aspects of the present disclosure provide calibration of gain in DTCs used in fractional frequency dividers. OLM 100 implemented as described above can be incorporated in a larger device or system as described briefly next.

8. System

Figure 7:
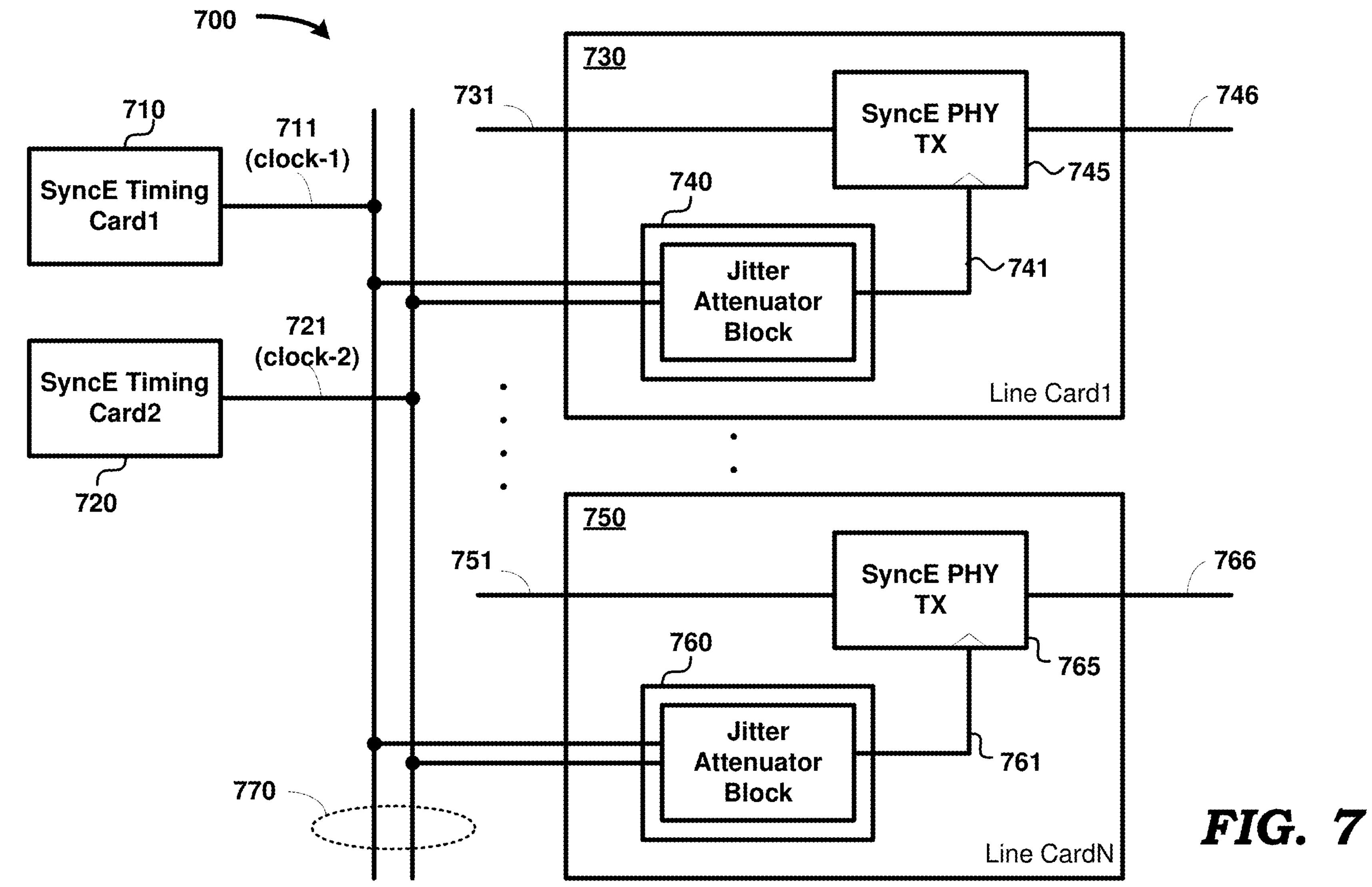
FIG. 7 is a block diagram of a system in which a device implemented according to several aspects of the present disclosure can be incorporated, in an embodiment of the present disclosure.

FIG. 7 is a block diagram of an example system containing a PLL implemented according to various aspects of the present disclosure, as described in detail above. System 700 is shown containing SyncE (Synchronous Ethernet) timing cards (710 and 720) and line cards 1 through N, of which only two line cards 730 and 750 are shown for simplicity. Line card 730 is shown containing jitter attenuator block 740 and SyncE PHY Transmitter 745. Line card 750 is shown containing jitter attenuator block 760 and SyncE PHY Transmitter 765. The components of FIG. 7 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 710 or 720). Accordingly, Ethernet packets are re-timed with respect to the master clock, and then transmitted in the physical layer. Thus, data packets (e.g., on path 731 and 751) are re-timed and transmitted without any time stamp information being recorded in the data packet. The packets may be generated by corresponding applications such as IPTV (Internet Protocol Television), VOIP (Voice over Internet Protocol), etc.

Thus, line card 730 receives a packet on path 731, and forwards the packet on output 746 after the packet has been re-timed (synchronized) with a master clock. Similarly, line card 750 receives a packet on path 751, and forwards the packet on output 766 after the packet has been re-timed (synchronized) with a master clock.

The master clock (711/clock 1) is generated by timing card 710. Timing card 720 generates a redundant clock (721/clock-2) that is to be used by line cards 730 and 750 upon failure of master clock 711. Master clock 711 and redundant clock 721 are provided via a backplane (represented by numeral 770) to each of lines cards 730 and 750.

In line card 730, jitter attenuator block 740 contains PLL 110 and OLM 100 (of FIG. 1), described above in detail, and receives clocks 711 and 721. Jitter attenuator block 740 generates an output clock 741 which is used to synchronize (re-time) packets received on path 731 and forwarded as re-timed packets on path 746.

Similarly, in line card 750, jitter attenuator block 760 also contains PLL 110 and OLM 100 (of FIG. 1), described above in detail, and receives clocks 711 and 721. Jitter attenuator block 760 generates an output clock 761 which is used to synchronize (re-time) packets received on path 751 and forwarded as re-timed packets on path 766.

9. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3A-3B and 7 although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

In the instant application, the power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An open-loop modulator (OLM) circuit for generating a fractional output clock having a frequency which is a desired fraction of that of a reference clock, wherein said desired fraction comprises an integer component and a fractional component, said OLM comprising:

a delta-sigma modulator (DSM) comprising:

a first portion coupled to receive said integer component and to generate a first sequence of codes; and a second portion coupled to receive said fractional component and to generate a corresponding second sequence of codes, wherein said first sequence of codes comprises a set of a lower value and a set of a higher value together representing said desired fraction on average;

a first divider coupled to receive said reference clock and each code of said first sequence of codes, and to generate a first divided signal having a period that is a multiple of the period of said reference clock, wherein the multiple is said each code;

a first digital-to-time converter (DTC) coupled to generate said fractional output clock from said first divided signal, said DTC providing a gain and said DTC having a gain-error; and a DTC-gain calibration circuit to generate a sequence of adjusted codes, said DTC-gain calibration circuit comprising:

a calibration phase-locked loop (PLL) coupled to receive said fractional output clock as a reference clock and to generate a feedback clock, said calibration PLL to synchronize said feedback clock with said reference clock, said calibration PLL having a forward path and a feedback path, a phase detector coupled to receive said fractional output clock and said feedback clock, and to generate a sequence of error signals representing phase error between said fractional output clock and said feedback clock at corresponding time points, said sequence of error signals indicative of said gain-error;

a matching block coupled to receive said second sequence of codes and to generate a corresponding sequence of matched codes; and a first multiplier coupled to receive said sequence of matched codes and said sequence of error signals, and to generate a product of corresponding ones of said sequence of matched codes and said sequence of error signals as a sequence of first-multiplier outputs;

a gain-adjustment-factor generator coupled to receive said sequence of first-multiplier outputs, and to generate a gain-adjustment-factor, said gain-adjustment-factor representing an inverse of a magnitude of said gain provided by said DTC; and a second multiplier coupled to receive said gain-adjustment-factor and to multiply each code of said second sequence of codes with said gain-adjustment-factor to generate said sequence of adjusted codes, wherein said first DTC operates to delay an edge of interest of said first divided signal by a time duration indicated by said corresponding adjusted code of said sequence of adjusted codes, wherein the signal transfer function of the combination of said second portion of said DSM and said matching block is matched with the signal transfer function of the combination of said calibration PLL and said phase detector.

2. The OLM circuit of claim 1, wherein a bandwidth of said matching block is configured to be equal to a bandwidth of said calibration PLL such that a shape of waveform of said sequence of matched codes in time is substantially similar to a shape of waveform of said sequence of error signals in time.

3. The OLM circuit of claim 1, wherein said matching block comprises:

a first accumulator coupled to receive said sequence of matched codes, and to generate a first sequence of accumulator-values;

a first gain-block having a first gain-factor of a first magnitude, wherein said first gain-block receives said first sequence of accumulated-values and scales each accumulator-value of said first sequence of accumulated-values by said first magnitude to generate a corresponding first sequence of scaled-values; and a subtractor block coupled to receive a code of said second sequence of codes and a corresponding one of said scaled-value of said first sequence of scaled-values, and to generate a sequence of difference values as said sequence of matched codes.

4. The OLM circuit of claim 3, wherein said gain-adjustment-factor generator comprises:

second accumulator coupled to receive said sequence of multiplier outputs, and to generate a second sequence of accumulator-values;

a second gain-block having a second gain-factor of a second magnitude, wherein said second gain-block receives said second sequence of accumulated-values and scales each accumulator-value of said second sequence of accumulated-values by said second magnitude to generate a corresponding second sequence of scaled-values, wherein said second sequence of scaled-values converges to a single value in steady-state;

an offset block providing a fixed offset-value; and an adder to add each scaled-value of said second sequence of said scaled-values to said offset-value, and to generate a sequence of added values, wherein each added value of said sequence of added values equals said gain-adjustment-factor in steady-state.

5. The OLM circuit of claim 4, wherein said feedback path comprises a feedback divider, wherein an offset-error is present between respective input paths on which said fractional output clock and said feedback clock are received, said OLM circuit further comprising an offset-correction circuit comprising:

a memory;

a first offset-correction DTC coupled to receive an output of said feedback divider and a first delay-code, and to delay each edge of interest of said output of said feedback divider by a duration corresponding to said first delay code, wherein said feedback clock is an output of said first offset-correction DTC;

a third accumulator coupled to receive said sequence of error signals, and to generate a third sequence of accumulator-values;

a third gain-block having a third gain-factor of a third magnitude, wherein said third gain-block receives said third sequence of accumulated-values and scales each accumulator-value of said third sequence of accumulated-values by said third magnitude to generate a corresponding third sequence of scaled-values, wherein said third sequence of scaled-values converges to an offset-correction-code in steady-state; and a second offset-correction DTC coupled to receive said output of said feedback divider and said offset-correction-code, and to generate an offset-corrected-feedback clock by delaying each edge of interest of said second divided signal by a duration corresponding to said offset-correction-code, wherein said phase detector is coupled to receive said offset-corrected-feedback clock.

6. The OLM circuit of claim 5, wherein each of said first offset-correction DTC and said second offset-correction DTC is designed to provide a maximum delay corresponding to a full-scale code (FS), wherein during a calibration phase of said offset-correction circuit:

at a first time instance prior to a first-time operation of said OLM circuit, said first delay-code is initialized to FS/2; and in a second time interval following said first time instance, said offset-correction loop reaches steady-state with said offset-correction-code settling to a first code, wherein the magnitude of said first code is stored as said offset-correction-code in said memory.

7. The OLM circuit of claim 6, wherein upon a power-up subsequent to said first-time operation:

said magnitude of said offset-correction-code is read from said memory;

said first delay-code is initialized to a magnitude equal to (FS/2 minus said offset-correction-code) when said offset-correction-code has a magnitude greater than zero and less than FS/2;

said first delay-code is initialized to a magnitude equal to zero when said offset-correction-code has a magnitude greater than FS/2 and less than or equal to FS; and said first delay-code is initialized to a magnitude equal to FS when said offset-correction-code has a magnitude equal to zero, wherein said offset-correction loop is operated to reach steady-state, and settles to a second code, wherein the magnitude of said second code is stored as said offset-correction-code in said memory.

8. The OLM circuit of claim 4, wherein said calibration PLL is a ring-oscillator PLL, wherein said DSM is a first-order delta-sigma modulator.

9. The OLM circuit of claim 8, further comprising:

an AND gate coupled to receive said fractional output clock and a control signal, and to generate a low-jitter fractional output clock as an AND-output, wherein said control signal is at logic LOW prior to said DTC-gain calibration circuit reaching steady-state operation, wherein said control signal is at logic HIGH upon said DTC-gain calibration circuit attaining steady-state operation.

10. The OLM circuit of claim 4, further comprising a look-up table containing corresponding values of bandwidth of said matching block for each combination of a respective operating frequency range of said fractional output clock and a respective bandwidth of said calibration PLL, wherein a bandwidth of said matching block is configured based on said look-up table.

11. A method performed in an open-loop modulator (OLM) circuit for generating a fractional output clock having a frequency which is a desired fraction of that of a reference clock, wherein said desired fraction comprises an integer component and a fractional component, said method comprising:

generating, by delta-sigma modulation technique, a first sequence of codes from said integer component, and a corresponding second sequence of codes from said fractional component;

dividing said reference clock based on each code of said first sequence of codes to form a divided signal, said divided signal having a period that is a multiple of the period of said reference clock, wherein the multiple is said each code;

delaying, by a digital to time converter (DTC), in a first time interval, edges of interest of said divided signal, based on corresponding ones of a sequence of uncalibrated codes to generate said fractional output clock, said DTC providing a gain in generating said fractional output clock and said DTC having a gain-error;

generating a feedback clock locked in phase to said fractional output clock;

identifying a sequence of phase errors between said fractional output clock and said feedback clock, said sequence of phase errors indicative of said gain-error;

transforming said second sequence of codes into a corresponding sequence of matched codes by high-pass filtering said second sequence of codes;

generating a gain-adjustment-factor, by:

multiplying each phase error of said sequence of phase errors with a corresponding one of said sequence of matched codes;

low-pass filtering and scaling the result of said multiplying; and offsetting the scaled output by a fixed offset value; and multiplying each code of said second sequence of codes with said gain-adjustment-factor to generate a corresponding adjusted code of a sequence of adjusted codes;

wherein said gain-adjustment-factor converges to a value equaling an inverse of a magnitude of said gain provided by said DTC at the end of said first time interval, wherein, starting from a second time interval following said first time interval, each edge of interest is delayed by said DTC by a time duration indicated by a corresponding adjusted code of said sequence of adjusted codes to generate said fractional output clock.

12. A system comprising:

a line card coupled to receive a data packet, said line card to re-time said data packet with reference to a selected clock, and to transmit a re-timed packet;

a first timing card to generate a first clock; and a power supply, wherein said line card comprises:

a phase-locked loop (PLL) coupled to receive said first clock, said PLL to generate a reference clock locked to said first clock; and an open-loop-modulator (OLM) coupled to receive said reference clock and to generate a fractional output clock having a frequency which is a desired fraction of that of said reference clock, wherein said OLM comprises:

a delta-sigma modulator (DSM) comprising:

a first portion coupled to receive said integer component and to generate a first sequence of codes; and a second portion coupled to receive said fractional component and to generate a corresponding second sequence of codes, wherein said first sequence of codes comprises a set of a lower value and a set of a higher value together representing said desired fraction on average;

a first divider coupled to receive said reference clock and each code of said first sequence of codes, and to generate a first divided signal having a period that is a multiple of the period of said reference clock, wherein the multiple is said each code;

a first digital-to-time converter (DTC) coupled to generate said fractional output clock from said first divided signal, said DTC providing a gain and said DTC having a gain-error; and a DTC-gain calibration circuit to generate a sequence of adjusted codes, said DTC-gain calibration circuit comprising:

a calibration phase-locked loop (PLL) coupled to receive said fractional output clock as a reference clock and to generate a feedback clock, said calibration PLL to synchronize said feedback clock with said reference clock, said calibration PLL having a forward path and a feedback path, a phase detector coupled to receive said fractional output clock and said feedback clock, and to generate a sequence of error signals representing phase error between said fractional output clock and said feedback clock at corresponding time points, said sequence of error signals indicative of said gain-error;

a matching block coupled to receive said second sequence of codes and to generate a corresponding sequence of matched codes; and a first multiplier coupled to receive said sequence of matched codes and said sequence of error signals, and to generate a product of corresponding ones of said sequence of matched codes and said sequence of error signals as a sequence of first-multiplier outputs;

a gain-adjustment-factor generator coupled to receive said sequence of first-multiplier outputs, and to generate a gain-adjustment-factor, said gain-adjustment-factor representing an inverse of a magnitude of said gain provided by said DTC; and a second multiplier coupled to receive said gain-adjustment-factor and to multiply each code of said second sequence of codes with said gain-adjustment-factor to generate said sequence of adjusted codes, wherein said first DTC operates to delay an edge of interest of said first divided signal by a time duration indicated by said corresponding adjusted code of said sequence of adjusted codes, wherein the signal transfer function of the combination of said second portion of said DSM and said matching block is matched with the signal transfer function of the combination of said calibration PLL and said phase detector.

13. The system of claim 12, wherein a bandwidth of said matching block is configured to be equal to a bandwidth of said calibration PLL such that a shape of waveform of said sequence of matched codes in time is substantially similar to a shape of waveform of said sequence of error signals in time.

14. The system of claim 12, wherein said matching block comprises:

a first accumulator coupled to receive said sequence of matched codes, and to generate a first sequence of accumulator-values;

a first gain-block having a first gain-factor of a first magnitude, wherein said first gain-block receives said first sequence of accumulated-values and scales each accumulator-value of said first sequence of accumulated-values by said first magnitude to generate a corresponding first sequence of scaled-values; and a subtractor block coupled to receive a code of said second sequence of codes and a corresponding one of said scaled-value of said first sequence of scaled-values, and to generate a sequence of difference values as said sequence of matched codes.

15. The system of claim 14, wherein said gain-adjustment-factor generator comprises:

a second accumulator coupled to receive said sequence of multiplier outputs, and to generate a second sequence of accumulator-values;

a second gain-block having a second gain-factor of a second magnitude, wherein said second gain-block receives said second sequence of accumulated-values and scales each accumulator-value of said second sequence of accumulated-values by said second magnitude to generate a corresponding second sequence of scaled-values, wherein said second sequence of scaled-values converges to a single value in steady-state;

an offset block providing a fixed offset-value; and an adder to add each scaled-value of said second sequence of said scaled-values to said offset-value, and to generate a sequence of added values, wherein each added value of said sequence of added values equals said gain-adjustment-factor in steady-state.

16. The system of claim 15, wherein said calibration PLL is a ring-oscillator PLL, wherein said DSM is a first-order delta-sigma modulator.

17. The system of claim 15, further comprising a look-up table containing corresponding values of bandwidth of said matching block for each combination of a respective operating frequency range of said fractional output clock and a respective bandwidth of said calibration PLL, wherein a bandwidth of said matching block is configured based on said look-up table.

18. The system of claim 15, further comprising:

an AND gate coupled to receive said fractional output clock and a control signal, and to generate a low-jitter fractional output clock as an AND-output, wherein said control signal is at logic LOW prior to said DTC-gain calibration circuit reaching steady-state operation, wherein said control signal is at logic HIGH upon said DTC-gain calibration circuit attaining steady-state operation.

19. The system of claim 15, wherein said feedback path comprises a feedback divider, wherein an offset-error is present between respective input paths on which said fractional output clock and said feedback clock are received, said OLM circuit further comprising an offset-correction circuit comprising:

a memory;

a first offset-correction DTC coupled to receive an output of said feedback divider and a first delay-code, and to delay each edge of interest of said output of said feedback divider by a duration corresponding to said first delay code, wherein said feedback clock is an output of said first offset-correction DTC;

a third accumulator coupled to receive said sequence of error signals, and to generate a third sequence of accumulator-values;

a third gain-block having a third gain-factor of a third magnitude, wherein said third gain-block receives said third sequence of accumulated-values and scales each accumulator-value of said third sequence of accumulated-values by said third magnitude to generate a corresponding third sequence of scaled-values, wherein said third sequence of scaled-values converges to an offset-correction-code in steady-state; and a second offset-correction DTC coupled to receive said output of said feedback divider and said offset-correction-code, and to generate an offset-corrected-feedback clock by delaying each edge of interest of said second divided signal by a duration corresponding to said offset-correction-code, wherein said phase detector is coupled to receive said offset-corrected-feedback clock.

20. The system of claim 19, wherein each of said first offset-correction DTC and said second offset-correction DTC is designed to provide a maximum delay corresponding to a full-scale code (FS), wherein during a calibration phase of said offset-correction circuit:

at a first time instance prior to a first-time operation of said OLM circuit, said first delay-code is initialized to FS/2; and in a second time interval following said first time instance, said offset-correction loop reaches steady-state with said offset-correction-code settling to a first code, wherein the magnitude of said first code is stored as said offset-correction-code in said memory, wherein upon a power-up subsequent to said first-time operation:

said magnitude of said offset-correction-code is read from said memory;

said first delay-code is initialized to a magnitude equal to (FS/2 minus said offset-correction-code) when said offset-correction-code has a magnitude greater than zero and less than FS/2;

said first delay-code is initialized to a magnitude equal to zero when said offset-correction-code has a magnitude greater than FS/2 and less than or equal to FS; and said first delay-code is initialized to a magnitude equal to FS when said offset-correction-code has a magnitude equal to zero, wherein said offset-correction loop is operated to reach steady-state, and settles to a second code, wherein the magnitude of said second code is stored as said offset-correction-code in said memory.

* * * * *